(12) United States Patent
Bechtel et al.

(10) Patent No.: US 7,495,386 B2
(45) Date of Patent: *Feb. 24, 2009

(54) ELECTROLUMINESCENT DEVICE WITH IMPROVED LIGHT OUTPUT

(75) Inventors: Hans Helmut Bechtel, Roetgen (DE); Wolfgang Busselt, Roetgen (DE); Joachim Opitz, Aachen (DE); Markus Heinrich Klein, Aachen (DE); Dietrich Bertram, Aachen (DE); Harald Gläser, Freiburg (DE)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/839,014

(22) Filed: Aug. 15, 2007

(65) Prior Publication Data

US 2008/0061688 A1    Mar. 13, 2008

Related U.S. Application Data

(63) Continuation of application No. 10/518,842, filed on Dec. 21, 2004, now Pat. No. 7,262,551.

(30) Foreign Application Priority Data

Jun. 28, 2002  (DE) ................. 102 28 937

(51) Int. Cl.
*H05B 33/00* (2006.01)

(52) U.S. Cl. ................. 313/504; 313/506; 428/917

(58) Field of Classification Search ........... 313/501, 313/506; 428/917, 690; 315/169.3; 345/45, 345/46, 76

See application file for complete search history.

(56) References Cited

U.S. PATENT DOCUMENTS

| 4,204,933 | A | 5/1980 | Barlow |
| 4,617,195 | A | 10/1986 | Mental |
| 5,405,710 | A | 4/1995 | Dodabalapur et al. |
| 5,834,893 | A | 11/1998 | Bulovic |
| 6,366,017 | B1 | 4/2002 | Antoniadis |
| 6,464,898 | B1 | 10/2002 | Tomoike et al. |
| 6,642,652 | B2 * | 11/2003 | Collins et al. ........... 313/512 |
| 6,734,624 | B2 | 5/2004 | Tada et al. |

FOREIGN PATENT DOCUMENTS

| JP | 62254394 A | 11/1987 |
| JP | 2000019317 A | 1/2000 |

OTHER PUBLICATIONS

By R.J. Visser; Entitled: "Application of Polymer Light-Emitting Materials in Light-Emitting Diodes, Backlights and Displays"; Philips Journal of Research Laboratories, Eindhoven, The Netherlands, vol. 51 No. 4, 1998, pp. 467-477.

* cited by examiner

*Primary Examiner*—Ashok Patel

(57) ABSTRACT

An electroluminescent device includes a substrate and a laminated body composed of a first electrode, an electroluminescent layer and a second electrode. The light output out of the electroluminescent device is increased by arranging a colloidal layer between the substrate and the laminated body. By using pigments in the colloidal layer, the emission color of the electroluminescent device can be changed and the daylight contrast improved.

8 Claims, 1 Drawing Sheet

ELECTROLUMINESCENT DEVICE WITH IMPROVED LIGHT OUTPUT

This is a continuation of U.S. patent application Ser. No. 10/518,842, filed on Dec. 21, 2004, now U.S. Pat. No. 7,262,551, the contents of which are incorporated herein by reference.

The invention relates to an electroluminescent device comprising a substrate and a laminated body composed of a first electrode, an electroluminescent layer and a second electrode.

Various embodiments of electronically driven display systems based on different principles are known and in widespread use.

In accordance with one of said principles use is made of organic light-emitting diodes, so-termed OLEDs, as the light source. Organic light-emitting diodes are built up of a plurality of function layers. In "Philips Journal of Research, 1998, 51, 467", a description is given of a typical structure of an OLED. A typical structure comprises an ITO (indium tin oxide) layer as the transparent electrode (anode), a conductive polymer layer, an electroluminescent layer, i.e. a layer of a light-emissive material, in particular a light-emissive polymer, and an electrode of a metal, preferably a metal having a low work function (cathode). Such a structure is usually provided on a substrate, generally glass. The light generated reaches the viewer through the substrate. An OLED comprising a light-emissive polymer in the electroluminescent layer is also referred to as a polyLED or PLED.

A drawback of such a device resides in that part of the light generated in the electroluminescent layer does not travel the shortest distance to leave the device in the direction of the viewer, but instead reaches the outer edges of the device as a result of total internal reflection at the interfaces between the individual layers, for example at the interface between the transparent electrode and the substrate. Up to 80% of the light generated is lost due to said total internal reflection.

Therefore, it is an object of the present invention to provide an OLED-based electroluminescent device that has an improved light output.

This object is achieved by an electroluminescent device comprising a substrate, a colloidal layer that borders on said substrate and a laminated body that borders on said colloidal layer and that is composed of a first electrode, an electroluminescent layer and a second electrode.

By incorporating said non-solid, colloidal layer into the layer sequence of an electroluminescent device, the total internal reflection of the emitted light is disturbed at the interface with the adjoining compact layer, and more light is coupled out of the electroluminescent device. The light is emitted through the substrate because the colloidal layer disturbs the total internal reflection and exhibits a low refractive index.

By virtue of the advantageous embodiment in accordance with claim 2, the light output out of a passive electroluminescent device is increased since the total internal reflection of the emitted light is disturbed at the interface with the substrate by the colloidal layer.

By virtue of the advantageous embodiment in accordance with claim 3, the light output in an active electroluminescent device is increased.

By virtue of the advantageous embodiments in accordance with claim 4 and claim 5, it is ensured that the colloidal layer is transparent to vertically penetrating visible light, and that no appreciable light scattering, which would reduce the contrast under ambient light conditions, takes place. If inorganic pigments are used as the particles in the colloidal layer, not only the light output is increased, but also the emission color of the electroluminescent device can be changed and the daylight contrast improved.

By virtue of the advantageous embodiment in accordance with claim 6, the particles in the colloidal layer can be adapted to the properties of the laminated body, for example to the wavelength of the light emitted by the electroluminescent layer.

These and other aspects of the invention will be apparent from and elucidated with reference to two Figures and three examples.

Figure 1:
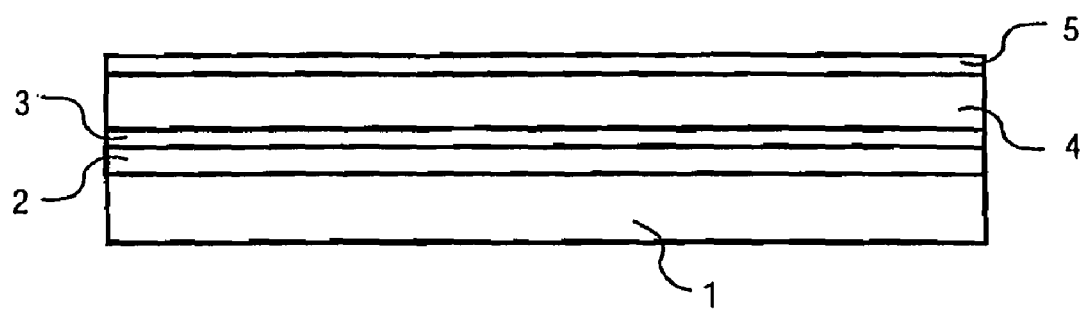
FIG. 1 is a cross-sectional view of an electroluminescent device.

As shown in FIG. 1, an electroluminescent device comprises a substrate 1, preferably a transparent glass plate or a transparent polymer foil. On the substrate 1 there is provided a colloidal layer 2 that is transparent to the light emitted by the electroluminescent device. The layer thickness of the colloidal layer 2 preferably ranges between 300 and 5000 nm. The colloidal layer 2 contains particles whose diameter preferably ranges between 1 and 400 nm. The layer thickness and the particle diameter are each selected such that the particles cause no appreciable light scattering.

The colloidal layer 2 is bordered by a laminated body comprising at least a first electrode 3, an electroluminescent layer 4 and a second electrode 5. The first electrode 3 serves as an anode and the second electrode 5 serves as a cathode. The electrodes 3, 5 are provided such that they form a two-dimensional array. The first electrode 3 is preferably transparent and may contain, for example, p-doped silicon or indium-doped tin oxide (ITO). The second electrode 5 may contain, for example, a metal such as aluminum, copper, silver or gold, an alloy or n-doped silicon. It may be preferred that the second electrode 5 comprises two or more conductive layers. It may be particularly preferred that the second electrode 5 comprises a first layer of an alkaline earth metal, such as calcium or barium, and a second layer of aluminum.

The electroluminescent layer 4 may contain either a light-emitting polymer or small, organic molecules. Dependent upon the type of material used in the electroluminescent layer 4, the devices are referred to as LEPs (Light Emitting Polymers) or polyLEDs or SMOLEDs (Small Molecule Organic Light Emitting Diodes). Preferably, the electroluminescent layer 4 contains a light-emitting polymer. For the light-emitting polymer use can be made of, for example, PPV or a substituted PPV, such as dialkoxy-substituted PPV.

Alternatively, the laminated body may comprise additional layers such as a hole-transporting layer and/or an electron-transporting layer. A hole-transporting layer is arranged between the first electrode 3 and the electroluminescent layer 4. An electron-transporting layer is situated between the second electrode 5 and the electroluminescent layer 4. Both layers preferably contain conductive polymers.

The electroluminescent layer 4 may be divided into a plurality of color pixels emitting light in the colors red, green and blue. To generate colored light, the material in the electroluminescent layer 4 may be doped with fluorescent dyes, or a polymer emitting colored light is used as the material in the electroluminescent layer 4. In a different embodiment, a polymer is used in the electroluminescent layer 4, which polymer emits light in a broad wavelength range, and color filters are used to generate, from this light, light in any one of the three primary colors red, green or blue.

When a suitable voltage of typically a few volts is applied to the electrodes 3, 5, positive and negative charge carriers are injected that migrate to the electroluminescent layer 4 where they recombine, thereby generating light. This light travels through the first electrode 3, the colloidal layer 2 and the substrate 1 before reaching the viewer. If the electroluminescent layer 4 is doped with fluorescent dyes, then the light generated by the electron-hole recombination excites the dyes, which in turn emit light in one of the three primary colors.

A colloidal layer 2 is a layer that was prepared from colloids or a colloidal solution. Colloids or colloidal solutions are heterogenic material systems containing very small particles that are invisible under a light microscope, which particles are dispersed in a liquid or gaseous medium. These particles are characterized by a very high surface-to-mass ratio. Consequently, a colloidal layer 2 is composed of the very small particles of a colloidal solution, the size of said particles ranging between 1 nm and 400 nm, preferably between 10 and 200 nm. A sharp, physico-chemically defined boundary between colloidal and fast solutions is as non-existent as that between colloidal solutions and precipitating suspensions.

The colloidal layer 2 may contain, for example, metal oxides such as $SnO_2$, $ZrO_2$ or $CeO_2$. The colloidal layer 2 may also contain, for example, $SiO_2$. Alternatively, the colloidal layer 2 may contain inorganic pigments. It may also be preferred that the colloidal layer 2 contains a combination of two or more of said materials. Suitable inorganic pigments are, for example, $CoO$—$Al_2O_3$, ultramarine, $TiO_2$—$CoO$—$NiO$—$ZrO_2$, $CeO$—$Cr_2O_3$—$TiO_2$—$Al_2O_3$, $TiO_2$—$ZrO$—$CoO$—$NiO$, $Fe_2O_3$, $CdS$—$CdSe$, $TaON$ or $Ca_{1-x}La_xTaO_{2-x}N_{1+x}$, where $0.3 \leq x \leq 1$. In a monochrome electroluminescent device, it may be advantageous that the colloidal layer 2 contains a yellow pigment, such as $Ca_{1-x}La_xTaO_{2-x}N_{1+x}$, where $0.3 \leq x \leq 1$, to attain an optimum daylight contrast.

In an electroluminescent device that serves as a color display screen, it may be advantageous that the electroluminescent layer 4 and the colloidal layer 2 are pixelated. In this embodiment, a pixel of the colloidal layer 2, which pixel is situated opposite a blue-emitting color pixel of the electroluminescent layer 4, contains blue pigments such as $CoO$—$Al_2O_3$ or ultramarine, and a segment of the colloidal layer 2, which segment is situated opposite a green-emitting color pixel of the electroluminescent layer 4, contains green pigments such as $TiO_2$—$CoO$—$NiO$—$ZrO_2$, $CeO$—$Cr_2O_3$—$TiO_2$—$Al_2O_3$ or $TiO_2$—$ZnO$—$CoO$—$NiO$, and a pixel of the colloidal layer 2, which pixel is situated opposite a red-emitting color pixel of the electroluminescent layer 4, contains red pigments such as $Fe_2O_3$, $CdS$—$CdSe$ or $TaON$.

Figure 2:
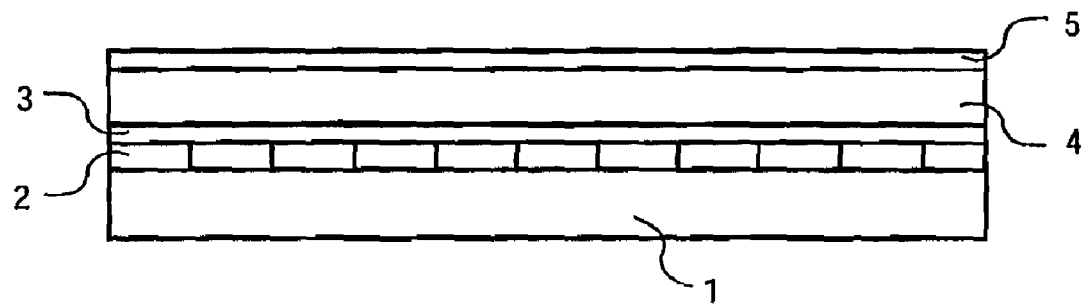
FIG. 2 is a sectional view of a further embodiment of an electroluminescent device.

FIG. 2 shows a further alternative embodiment in which only the colloidal layer 2 is divided into pixels, and the electroluminescent layer 4 emits white light. By means of said different, colored pigments in the pixel-shaped colloidal layer 2, colored light is generated from the white light.

To prepare a colloidal layer 2, aqueous colloidal solutions of the particles are produced first. The concentration of the particles in this solution preferably ranges between 3 and 10 wt. %. In addition, additives may be admixed with the solution, which additives increase the wetting properties or the viscosity of the aqueous, colloidal solution.

The aqueous, colloidal solution is preferably spin-coated onto the substrate 1. In this process it may be advantageous to press the aqueous, colloidal solution through a membrane filter in order to remove dust and other particulate impurities. The substrate 1 to be coated is attached onto a spin coater and the aqueous, colloidal solution is applied to the rotating substrate 1 at 100 to 1000 rpm. During said rotation of the substrate, the liquid film is dried using an infrared lamp and, subsequently, the coated substrate obtained is exposed to temperatures in the range of 150 to 180° C. in a furnace. A transparent colloidal layer 2 that adheres firmly to the substrate 1 is obtained.

To prepare a pixelated colloidal layer 2, use can be made of, for example, a "lift-off" process such as used, for example, to manufacture a black matrix in a cathode ray tube.

The colloidal layer 2 may have a varying refractive index. For this reason, the above-described manufacturing process is repeated two or more times, and the aqueous colloidal solution each time has a different particle concentration. In this embodiment it is preferred that, in the colloidal layer 2, the refractive index on the side facing away from the substrate 1 is larger than the refractive index on the side that borders on the substrate 1.

After the colloidal layer 2 has been manufactured, the layers of the laminated body are provided using known methods and structured in accordance with their function. The finished electroluminescent device can be provided with further layers or with a housing, which protect the materials used for the electroluminescent device against mechanical loads, moisture, etc.

Alternatively, the colloidal layer 2 may be present on the side of the laminated body facing away from the substrate. This is advantageous, in particular, in the case of an actively driven electroluminescent device. In an actively driven electroluminescent device, the first electrode 3 has a pixel structure and each individual pixel structure is driven by at least two thin-film transistors and one capacitor. In an active electroluminescent device, the structural elements necessary to drive the pixelated first electrode 3 are provided on the substrate 1, and the laminated body borders on the substrate 1. The light generated in the electroluminescent layer 4 is emitted through a transparent second electrode 5. In an actively driven electroluminescent device, the light output is increased by providing the colloidal layer 2 on the laminated body at a location where it borders on the second electrode 5.

EXAMPLE 1

An aqueous, colloidal solution of $SiO_2$ having an $SiO_2$ concentration of 5% by weight was prepared by diluting a colloidal solution of $SiO_2$ with a particle diameter of 50 nm (Levasil© VPAC 4056) using de-ionized water. The aqueous colloidal solution obtained was passed through a membrane filter having a pore size of 5 μm. For the substrate 1 use was made of an 1.1 mm thick glass plate which was clamped in a spin coater and coated with said aqueous, colloidal solution of $SiO_2$. In this process, the substrate 1 was rotated at 200 rpm, and, during said rotation, the solution was dried by means of an infrared lamp. Subsequently, the coated substrate 1 was placed in an oven and exposed to a temperature of 150° C. The colloidal layer 2 of $SiO_2$, which adhered well to the substrate 1, had a layer thickness of 200 nm.

Subsequently a 140 nm thick layer of ITO as the first electrode 3 was provided on the colloidal layer 2 and subsequently structured. Next, in succession, a 200 nm thick layer of polyethylene dioxythiophene (PDOT) as the hole-conducting layer and a 80 nm thick layer of poly(p-phenylene vinylene) (PPV) as the electroluminescent layer 4 were provided. The second electrode 5 composed of a 5 nm thick layer of Ba and of a 200 nm thick layer of Al was applied to the layer of PPV.

EXAMPLE 2

An electroluminescent device was manufactured in a manner analogous to that described in example 1, which electroluminescent device contained, in the colloidal layer 2, $CeO_2$ having a particle diameter in the range between 10 and 20 nm. To prepare the aqueous colloidal solution, 52 g of a 10% aqueous polyvinyl alcohol solution and 249 g de-ionized water were added to 150 g of a 20% $CeO_2$-sol (Nyacol© Ceria $CeO_2$ ACT). The finished colloidal layer 2 had a layer thickness of 1.5 μm.

EXAMPLE 3

An electroluminescent device was manufactured in a manner analogous to that described in example 1, which electroluminescent device contained, in the colloidal layer 2, $Ca_{0.5}La_{0.5}TaO_{1.5}N_{1.5}$ having a particle diameter of approximately 150 nm. To prepare the aqueous colloidal solution, the pigment was suspended in an appropriate quantity of de-ionized water wherein anionic polyelectrolyte in a quantity of 2.5 wt. %, with respect to $Ca_{0.5}La_{0.5}TaO_{1.5}N_{1.5}$, was dissolved as the dispersing agent. The colloidal solution further contained 1.5 wt. % polyvinyl alcohol. The finished colloidal layer 2 had a layer thickness of 3 μm.

The invention claimed is:

1. An electroluminescent device comprising:
   a substrate,
   a colloidal layer having a varying refractive index, and
   a laminated body comprising a first electrode, an electroluminescent layer, and a second electrode wherein the laminated body borders on the colloidal layer and the colloidal layer is positioned between the substrate and the laminated body.

2. The electroluminescent device of claim 1, wherein the colloidal layer comprises a material selected from the group consisting of:
   the metal oxides, SiO2, the inorganic pigments, and a combination thereof.

3. The electroluminescent device of claim 2, wherein the material has a particle size in the range between 1 and 400 nm.

4. An electroluminescent device comprising:
   a substrate,
   a colloidal layer having a varying refractive index, and
   a laminated body comprising a first electrode, an electroluminescent layer, and a second electrode,
   wherein the colloidal layer is a pixelated layer.

5. The electroluminescent device of claim 4, wherein the colloidal layer contains pigments.

6. The electroluminescent device of claim 5, wherein the pigments are colored.

7. The electroluminescent device of claim 6, wherein the electroluminescent layer emits white light.

8. The electroluminescent device of claim 4, wherein the electroluminescent layer is a pixelated layer.

* * * * *